(12) United States Patent
Lee et al.

(10) Patent No.: US 11,050,404 B2
(45) Date of Patent: Jun. 29, 2021

(54) BULK-ACOUSTIC WAVE RESONATOR

(71) Applicant: Samsung Electro-Mechanics Co., Ltd., Suwon-si (KR)

(72) Inventors: Tae Kyung Lee, Suwon-si (KR); Yoon Sok Park, Suwon-si (KR); Dae Hun Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 62 days.

(21) Appl. No.: 16/411,273

(22) Filed: May 14, 2019

(65) Prior Publication Data
US 2020/0186125 A1 Jun. 11, 2020

(30) Foreign Application Priority Data

Dec. 7, 2018 (KR) ........................ 10-2018-0156734

(51) Int. Cl.
*H03H 9/02* (2006.01)
*H03H 9/54* (2006.01)
*H03H 9/205* (2006.01)

(52) U.S. Cl.
CPC .... *H03H 9/02157* (2013.01); *H03H 9/02007* (2013.01); *H03H 9/205* (2013.01); *H03H 9/54* (2013.01)

(58) Field of Classification Search
CPC ...... H03H 9/54; H03H 9/205; H03H 9/02007; H03H 9/02157; H03H 9/02133; H03H 9/02102

USPC ......................................... 333/133, 187, 188
See application file for complete search history.

(56) References Cited

U.S. PATENT DOCUMENTS

| 8,629,598 B2 | 1/2014 | Yamane |
| 9,929,714 B2 | 3/2018 | Jacobsen et al. |
| 2017/0141750 A1* | 5/2017 | Pelzel .................. H01L 41/083 |

FOREIGN PATENT DOCUMENTS

| JP | 4541147 B2 | 9/2010 |
| WO | WO 2004/025832 A1 | 3/2004 |

OTHER PUBLICATIONS

"Silicon Dioxide Properties" https://www.iue.tuwien.ac.at/phd/filipovic/node26.html, Date Accessed Aug. 27, 2020 (Year: 2020).*
Accuratus, "Silicon Carbide Material Properties" https://accuratus.com/pdf/sicprops.pdf, Date Accessed Aug. 27, 2020 (Year: 2020).*

* cited by examiner

*Primary Examiner* — Robert J Pascal
*Assistant Examiner* — Jorge L Salazar, Jr.
(74) *Attorney, Agent, or Firm* — NSIP Law

(57) ABSTRACT

A bulk-acoustic wave resonator includes: a first substrate formed of a first material; an insulating layer or a piezoelectric layer disposed on a first side of the first substrate; and a second substrate formed of a second material and disposed on a second side of the first substrate, wherein the second material has thermal conductivity that is higher than a thermal conductivity of the first material.

18 Claims, 9 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2018-0156734 filed on Dec. 7, 2018 in the Korean Intellectual Property Office, the entire disclosure of which is incorporated herein by reference for all purposes.

BACKGROUND

1. Field

The following description relates to a bulk-acoustic wave resonator and a bulk surface wave filter including a bulk-acoustic wave resonator.

2. Description of Related Art

As 5G communication modules emerge, it is necessary to develop bulk acoustic wave filters for 5G and bulk-acoustic wave resonators suitable for such filters.

A frequency band that can be implemented by a bulk-acoustic wave resonator (FBAR) is generally 6 GHz or less. A bulk-acoustic wave resonator for a frequency band of 2 GHz to 3 GHz can be easily implemented by adjusting a thickness of an electrode and a thickness of a piezoelectric layer. However, since a bulk-acoustic wave resonator for a 5 GHz frequency band is expected to present considerable manufacturing process difficulties and is expected to have degraded performance, it is difficult to implement a bulk-acoustic wave resonator for a 5 GHz frequency band. In addition, since a considerable amount of heat is generated inside a bulk-acoustic wave resonator for a 5 GHz frequency band, a structure for appropriately dissipating such heat is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A bulk-acoustic wave resonator includes: a first substrate formed of a first material; an insulating layer or a piezoelectric layer disposed on a first side of the first substrate; and a second substrate formed of a second material, and disposed on a second side of the first substrate, wherein the second material has thermal conductivity that is higher than a thermal conductivity of the first material.

$0.25 < t1/t2 < 0.67$ may be satisfied, wherein t1 is a thickness of the first substrate, and t2 is a thickness of the second substrate.

The first substrate may be formed of silicon (Si), and the second substrate may be formed of a silicon carbide (SiC) compound.

The bulk-acoustic wave resonator may further include: a third substrate disposed on one side of the second substrate.

The third substrate may be formed of the first material.

$0.25 < (t1+t3)/t2 < 0.67$ may be satisfied, wherein t1 is a thickness of the first substrate, t2 is a thickness of the second substrate, and t3 is a thickness of the third substrate.

A thickness of the third substrate may be less than a thickness of the first substrate.

The bulk-acoustic wave resonator may further include: a fourth substrate disposed on one side of the third substrate.

The fourth substrate may be formed of the second material.

A thickness of the fourth substrate may be less than a thickness of the second substrate.

$0.25 < (t1+t3)/(t2+t4) < 0.67$ may be satisfied, wherein t1 is a thickness of the first substrate, t2 is a thickness of the second substrate, t3 is a thickness of the third substrate, and t4 is a thickness of the fourth substrate.

In another general aspect, a bulk acoustic wave filter includes the bulk-acoustic wave resonator described above.

In another general aspect, a bulk-acoustic wave resonator includes: a first substrate formed of silicon (Si); an insulating layer disposed on a first side of the first substrate; a membrane layer disposed on the insulating layer, and defining a cavity between insulating layer and the membrane layer; a piezoelectric layer disposed on the membrane layer; and a second substrate formed of a silicon carbide (SiC) compound, and disposed on a second side of the first substrate.

A thickness of the second substrate may be greater than a thickness of the first substrate.

The bulk-acoustic wave resonator may further include: a third substrate formed of Si and disposed on a side of the second substrate that is opposite to a side of the second substrate that is disposed on the second side of the first substrate.

A thickness of the second substrate may be greater than a thickness of the first substrate. A thickness of the third substrate may be less than the thickness of the first substrate.

The bulk-acoustic wave resonator may further include: a fourth substrate formed of the SiC compound and disposed on a side of the third substrate that is opposite to a side of the third substrate that is disposed on the second substrate.

A thickness of the second substrate may be greater than a thickness of the first substrate. A thickness of the third substrate may be less than the thickness of the first substrate. A thickness of the fourth substrate may be less than the thickness of the second substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
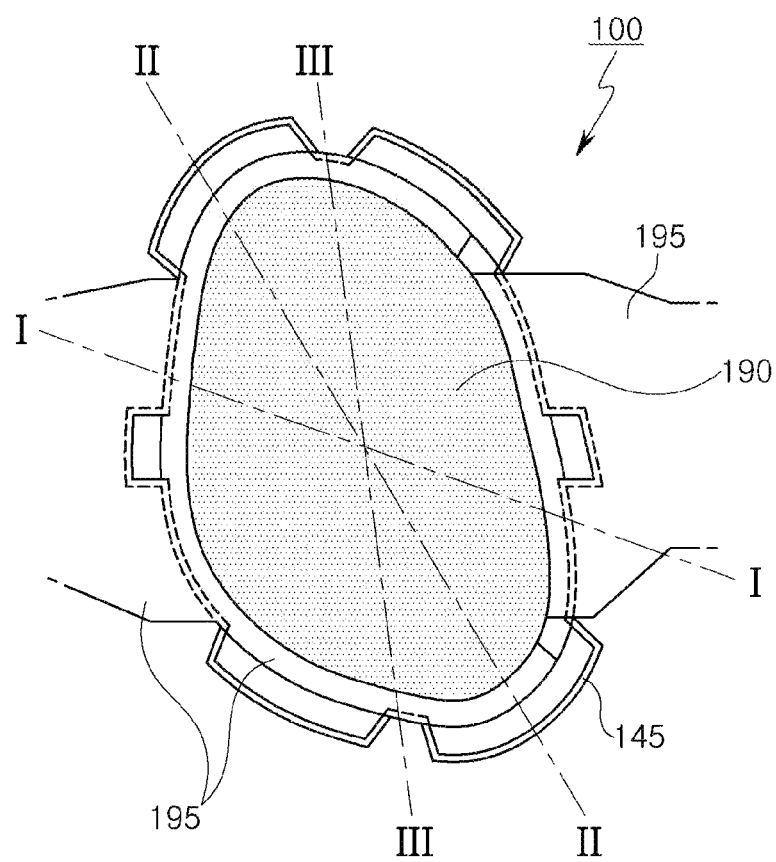
FIG. 1 is a plan view of a bulk-acoustic wave resonator, according to an example.
Figure 2:
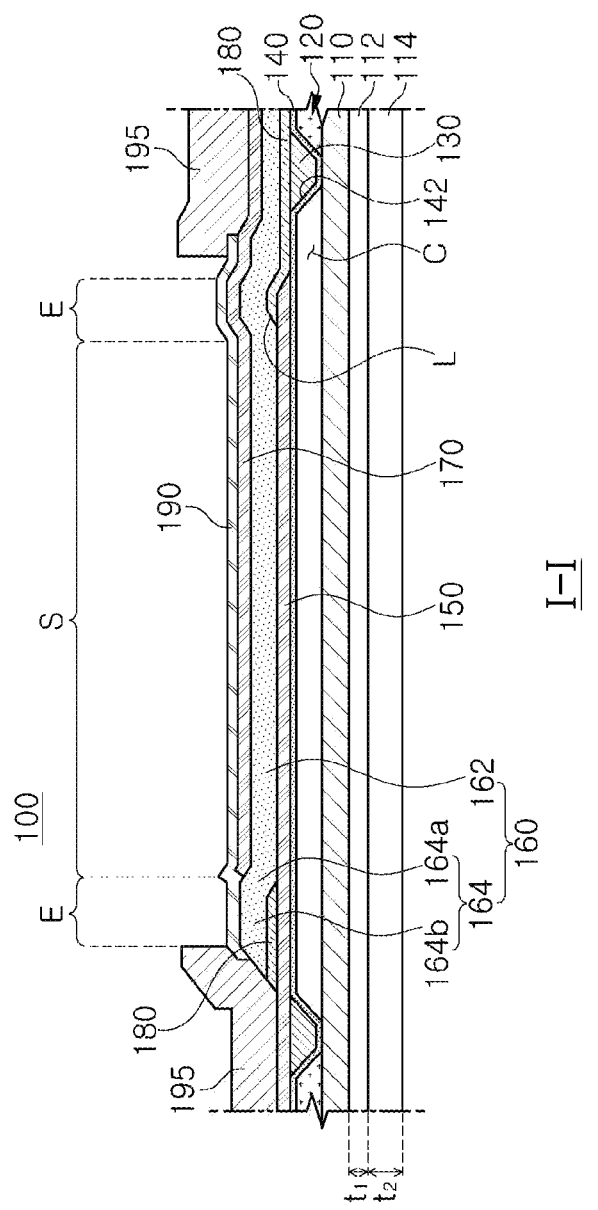
FIG. 2 is a cross-sectional view taken along line I-I of FIG. 1.
Figure 3:
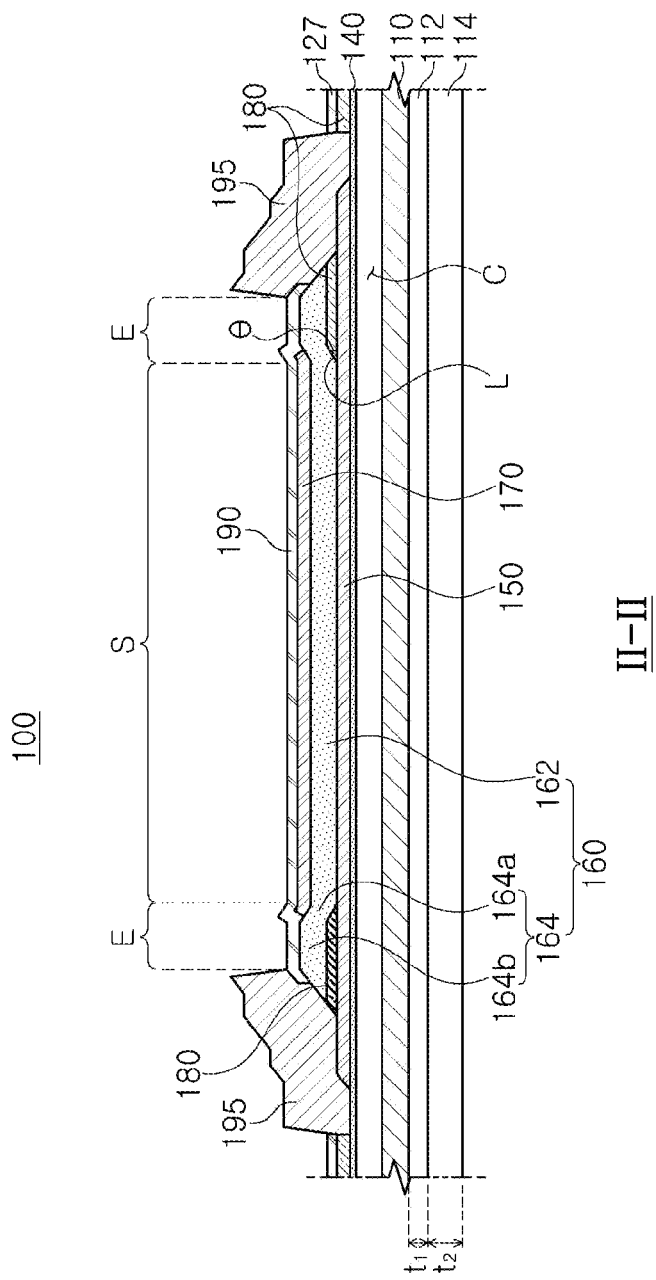
FIG. 3 is a cross-sectional view taken along line II-II of FIG. 1.
Figure 4:
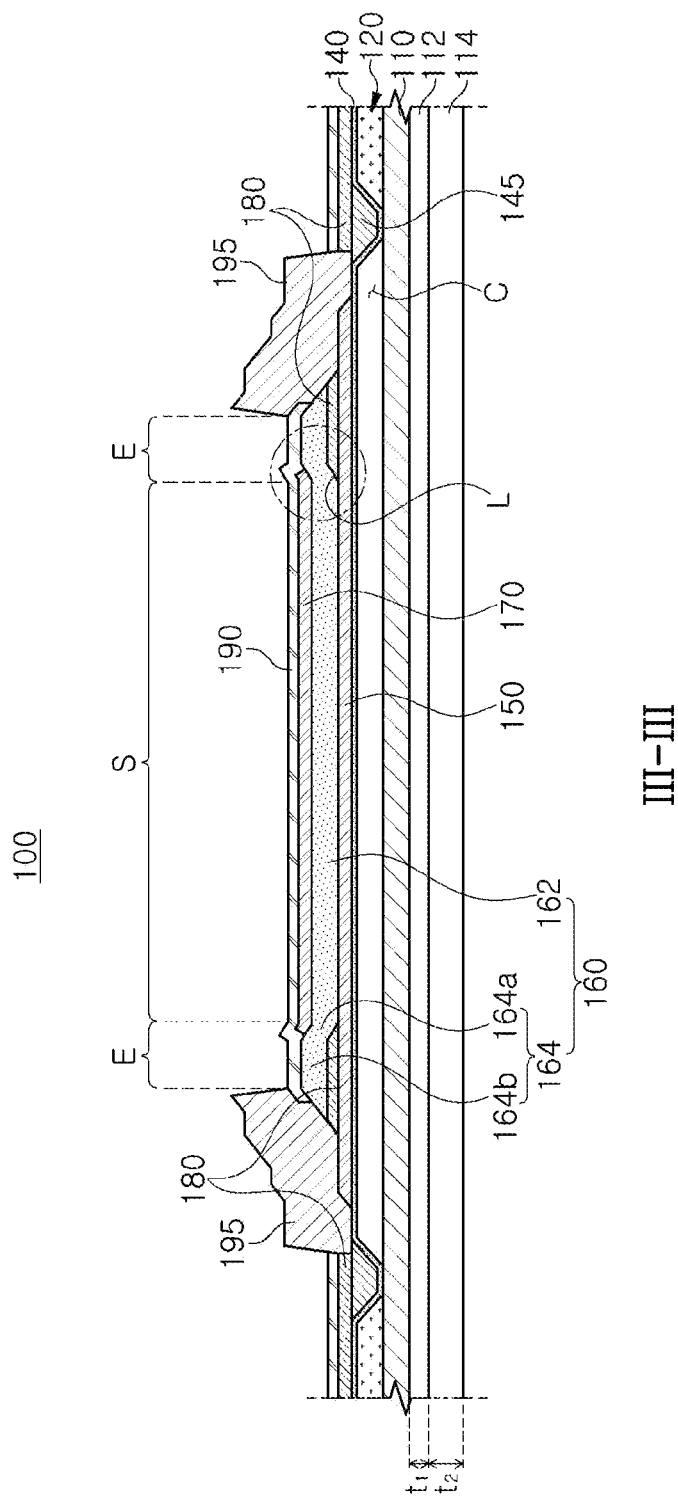
FIG. 4 is a cross-sectional view taken along line III-III of FIG. 1.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Referring to FIGS. 1 to 4, a bulk-acoustic wave resonator 100, according to an example, will be described.

The bulk-acoustic wave resonator 100 may include a first substrate 112, a second substrate 114, a sacrificial layer 120, an etching preventing portion 130, a membrane layer 140, a first electrode 150, a piezoelectric layer 160, a second electrode 170, an insertion layer 180, a passivation layer 190, and a metal pad 195.

The first substrate 112 may be formed of a single crystal material. For example, the first substrate 112 may be formed of silicon (Si).

An insulating layer 110 may be formed on an upper surface of the first substrate 112. The insulating layer 110 may serve to electrically isolate a configuration, to be disposed in an upper surface of the first substrate 112, from the first substrate 112. In addition, the insulating layer 110 may serve to prevent the first substrate 112 from being etched by etching gas.

The second substrate 114 is formed on a lower surface of the first substrate 112. The second substrate 114 may be formed of a material having material properties different from those of the first substrate 112. For example, the second substrate 114 may be formed of silicon carbide (SiC). A thickness t2 of the second substrate 114 may be greater than a thickness t1 of the first substrate 112. In addition, the thickness t1 of the first substrate 112 and the thickness t2 of the second substrate 114 may satisfy Conditional Expression 1, provided below.

$$0.25 < t1/t2 < 0.67 \qquad \text{[Conditional Expression 1]}$$

The insulating layer 110 may be formed of any one or any combination of any two or more of silicon dioxide ($SiO_2$), silicon nitride ($Si_3N_4$), aluminum oxide ($Al_2O_3$), and aluminum nitride (AlN), and may be formed through a process among chemical vapor deposition, radio frequency (RF) magnetron sputtering, and evaporation.

The sacrificial layer 120 is formed on one side of the insulating layer 110. The sacrificial layer 120 may be only formed in a portion of the insulating layer 110. For example, the sacrificial layer 120 may be formed in an upper region of the insulating layer 110, except for the cavity C and the etching preventing portion 130. However, a formation region of the sacrificial layer 120 is not limited to the portion described above. For example, the sacrificial layer 120 may also be formed in a region of the cavity C. However, a portion of the sacrificial layer 120 formed in the region of the cavity C may be removed during a method for manufacturing the bulk-acoustic wave resonator 100. The sacrificial layer 120 may be used as a base layer for formation of an electrode. For example, the first electrode 150 may be formed on an upper portion of the sacrificial layer 120. The etching preventing portion 130 may be formed along a boundary of the cavity C. The etching preventing portion 130 may define an etching region in a formation method of the cavity C.

The membrane layer 140 may form the cavity C, together with the first substrate 112. The membrane layer 140 may be formed of a material with low reactivity with etching gas used in formation of the cavity C. The etching preventing portion 130 is formed in a groove portion 142 formed by the membrane layer 140. The membrane layer 140 may be formed of a dielectric material containing any one material among silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown), which may be formed of aluminum nitride (AlN), may be formed on the membrane layer 140. The seed layer may be disposed between the membrane layer 140 and the first electrode 150. The seed layer may be formed using a dielectric, or a metal, having a hexagonal close packed (HCP) crystal structure, in addition to aluminum nitride (AlN). For example, the seed layer may be formed of titanium (Ti).

The first electrode 150 may be formed on a portion of the membrane layer 140 covering an upper portion of the cavity C. For example, the first electrode 150 may extend in a direction from one side of the cavity C to another side of the cavity C. The first electrode 150, formed as described above, may be used as either one of an input electrode and an output electrode, inputting and outputting, respectively, an electrical signal such as a radio frequency (RF) signal, or the like.

The first electrode 150 may be formed of an aluminum alloy material containing scandium (Sc). The first electrode 150, formed of the material described above, has high mechanical strength, and thus may be formed by high power reactive sputtering. The first electrode 150, formed of the material described above and formed by the process described above, may lower surface roughness, and may induce highly oriented growth of the piezoelectric layer 160 therethrough.

Scandium (Sc) may increase chemical resistance of the first electrode 150, thereby compensating for the disadvantage of a first electrode formed of aluminum. In addition, scandium may secure process stability such as a dry etch or wet process, or the like, during manufacturing. Furthermore, scandium may improve chemical resistance of the first electrode 150.

For example, an electrode having a thickness of 1500 Å was formed using a molybdenum (Mo) material, another electrode having a thickness of 1500 Å was formed using an aluminum alloy (AlSc) material containing 0.625 at % of scandium, and then a sheet resistance of each of the electrodes was measured. The electrode formed using the molybdenum (Mo) material had a sheet resistance of 0.9685. However, the electrode formed using the aluminum alloy (AlSc) material containing 0.625 at % of scandium had sheet resistance is 0.316. As described above, in the case in which the electrode was formed using the aluminum alloy (AlSc) material, it was confirmed that the sheet resistance was lowered as compared with the case in which the electrode was formed using the molybdenum (Mo) material.

The content of scandium (Sc) may be 0.1 at % to 5 at %. If the content of scandium (Sc) is less than 0.1 at %, a reduction in mechanical properties caused by aluminum (Al) and hillocks, and the like, may occur. On the other hand, if the content of scandium (Sc) is greater than or equal to 5 at %, it is difficult to address the electrical loss indicating the sheet resistance, and surface roughness of the first electrode is increased to adversely affect crystal orientation.

The first electrode 150, which includes scandium, also has excellent galvanic corrosion characteristics with the metal pad 195, thereby providing stability in a manufacturing process. For example, members of pure aluminum (Al) and an aluminum alloy (AlSc, 0.625 at %) containing scandium were deposited at a thickness of 1500 Å to be in contact with gold (Au), which is mainly used as a material of the metal pad 195, and were then immersed in an electrolyte solution for 65 hours. Applicant compared galvanic corrosion characteristics of the pure Aluminum (Al) and the aluminum alloy (AlSc, 0.625 at %) containing scandium. As a result of comparison, in the case of the member of the aluminum alloy (AlSc, 0.625 at %) containing scandium, a change in a surface was not observed. On the other hand, in the case of the member of the pure aluminum material, corrosion with gold (Au) was observed. Thus, in the case in which the first electrode 150 is formed using the aluminum alloy (AlSc) containing scandium, excellent galvanic corrosion characteristics may also be provided in a manufacturing process.

Accordingly, the first electrode 150 is formed of the aluminum alloy (AlSc) only containing scandium (Sc) in addition to aluminum (Al). In other words, any additional metals other than scandium (Sc) are not contained in the aluminum alloy. If any additional metals other than scandium (Sc) were contained in an aluminum alloy, the aluminum alloy would be a ternary system in a phase diagram. In this case, it would be difficult to control a composition and a complicated phase system may be provided, so compositional unevenness and an undesired crystal phase may be provided.

Further, if the first electrode 150 were formed of an aluminum alloy having a ternary system, roughness of a surface would be increased due to compositional unevenness and formation of an undesired crystal phase, so crystal orientation may be adversely affected when the piezoelectric layer 160 is formed.

Thus, when the first electrode 150 is formed of the aluminum alloy (AlSc) only containing scandium (Sc) in addition to aluminum (Al), crystal orientation of the piezoelectric layer 160, which is disposed on an upper portion of the first electrode 150, may be improved.

For reference, in the above description, the first electrode is formed of AlSc, but the first electrode may alternatively be formed of any one among gold (Au), titanium (Ti), tantalum (Ta), molybdenum (Mo), ruthenium (Ru), platinum (Pt), tungsten (W), aluminum (Al), and nickel (Ni), or an alloy of gold (Au), titanium (Ti), tantalum (Ta), molybdenum (Mo), ruthenium (Ru), platinum (Pt), tungsten (W), aluminum (Al), or nickel (Ni).

The piezoelectric layer 160 is formed to cover at least a portion of the first electrode 150 that is disposed on an upper portion of the cavity C. The piezoelectric layer 160 is a layer causing a piezoelectric effect to convert electrical energy into mechanical energy in the form of elastic waves, and may be formed of any one among aluminum nitride (AlN), zinc oxide (ZnO), and lead zirconium titanium oxide (PZT; PbZrTiO). In detail, when the piezoelectric layer 160 is formed of aluminum nitride (AlN), the first electrode 150 may further include a rare earth metal. For example, the rare earth metal includes any one or any combination of any two or more of scandium (Sc), erbium (Er), yttrium (Y), and lanthanum (La). Moreover, for example, a transition metal includes any one or any combination of any two or more of titanium (Ti), zirconium (Zr), hafnium (Hf), tantalum (Ta), and niobium (Nb). Moreover, magnesium (Mg), which is a divalent metal, may be also included therein.

Moreover, the content of elements contained in the aluminum nitride (AlN) to improve piezoelectric characteristics is preferably 0.1 at % to 30 at %. If the content of elements contained to improve piezoelectric characteristics is less than 0.1 at %, piezoelectric characteristics that are higher than those of the aluminum nitride (AlN) may not be implemented. On the other hand, if the content of elements contained to improve piezoelectric characteristics is greater than 30 at %, it may be difficult to perform manufacturing and composition controlling for deposition, and thus a nonuniform phase may be formed. Moreover, if the content of elements is greater than 30 at %, the probability of abnormal grain growth may be significantly increased. Thus, a significant surface defect may be generated in the piezoelectric layer 160.

The piezoelectric layer 160 includes a piezoelectric portion 162 disposed in a flat portion S of the bulk-acoustic wave resonator 100, and a bent portion 164 disposed in an expansion portion E of the bulk-acoustic wave resonator 100.

The piezoelectric portion 162 is a portion directly stacked on an upper surface of the first electrode 150. Thus, the piezoelectric portion 162 is interposed between the first electrode 150 and the second electrode 170, and provided to have a flat shape together with the first electrode 150 and the second electrode 170.

The bent portion 164 is, for example, a region extended outwardly from the piezoelectric portion 162, and located within the expansion portion E.

The bent portion 164 is disposed on the insertion layer 180, which will be described later, and is formed to have a shape which rises along a shape of the insertion layer 180. The piezoelectric layer 160 is curved at a boundary between the piezoelectric portion 162 and the bent portion 164, and the bent portion 164 rises corresponding to a thickness and a shape of the insertion layer 180.

The bent portion 164 may include an inclined portion 164a and an extended portion 164b.

The inclined portion 164a refers to a portion formed to be inclined along an inclined surface L of the insertion layer 180, to be described later. Moreover, the extended portion 164b refers to a portion extended outwardly from the inclined portion 164a.

The inclined portion 164a is formed parallel to the inclined surface L of the insertion layer 180, and an inclination angle of the inclined portion 164a may be equal to an inclination angle (θ of FIG. 3) of the inclined surface L of the insertion layer 180.

When the piezoelectric layer 160 is stacked, tensile stress is applied to the piezoelectric layer 160, and the tensile stress applied to the piezoelectric layer 160 may be 0 Mpa to 500 Mpa. In this case, when the piezoelectric layer 160 is aluminum nitride, or aluminum nitride containing doping elements, a ratio c/a of an out-of-plane lattice constant (c) to an in-plane lattice constant (a) is less than 1.58. As described above, tensile stress of 0 Mpa to 500 Mpa is applied to the piezoelectric layer 160, so a void in the first electrode 150 may be prevented from being generated. In other words, migration of a material (particles) forming the first electrode 150 is prevented, so occurrence of a surface defect may be prevented.

On the other hand, if the ratio c/a in a first electrode is greater than 1.58, the number of voids generated in the first electrode increases rapidly. Moreover, when the ratio c/a between lattice constants is less than 1.58, tensile stress is applied, so generation of a void in the first electrode 150 may be prevented.

As described above, when the piezoelectric layer 160 is stacked, tensile stress is applied to the piezoelectric layer 160, so a ratio c/a of lattice constants of the piezoelectric layer 160 is less than 1.58.

The second electrode 170 is formed to cover at least the piezoelectric layer 160, which is disposed on an upper portion of the cavity C. The second electrode 170 may be used as one of an input electrode and an output electrode, inputting and outputting, respectively, an electrical signal such as an RF signal, or the like. In other words, when the first electrode 150 is used as an input electrode, the second electrode 170 may be used as an output electrode. Alternatively, when the first electrode 150 is used as an output electrode, the second electrode 170 may be used as an input electrode.

The second electrode 170 may be formed of an aluminum alloy material containing scandium (Sc), in a manner similar to the first electrode 150.

Moreover, the second electrode 170 may be formed of the aluminum alloy (AlSc) only containing scandium (Sc) in addition to aluminum (Al). In other words, no additional metals other than scandium (Sc) are contained in the aluminum alloy. If any additional metals other than scandium (Sc) were to be contained in the aluminum alloy, the aluminum alloy would be a ternary system in a phase diagram. In this case, it would be difficult to control a composition and a complicated phase system may be provided, so that compositional unevenness and an undesired crystal phase may be provided.

Further, if the second electrode 170 were formed of an aluminum alloy having a ternary system, roughness of a surface would be increased due to compositional unevenness and formation of an undesired crystal phase, so crystal orientation may be adversely affected when the passivation layer 190 is formed.

Thus, when the second electrode 170 is formed of the aluminum alloy (AlSc) only containing scandium (Sc) in addition to aluminum (Al), crystal orientation of the passivation layer 190, disposed on an upper portion of the second electrode 170, may be improved.

For reference, in the above description, the first electrode is formed of AlSc, but the first electrode may be formed of any one among gold (Au), titanium (Ti), tantalum (Ta), molybdenum (Mo), ruthenium (Ru), platinum (Pt), tungsten (W), aluminum (Al), and nickel (Ni), or an alloy of gold (Au), titanium (Ti), tantalum (Ta), molybdenum (Mo), ruthenium (Ru), platinum (Pt), tungsten (W), aluminum (Al), or nickel (Ni).

The insertion layer 180 is disposed between the first electrode 150 and the piezoelectric layer 160. The insertion layer 180 may be formed of a dielectric material such as silicon oxide (SiO$_2$), aluminum nitride (AlN), aluminum oxide (Al$_2$O$_3$), silicon nitride (Si$_3$N$_4$), manganese oxide (MgO), zirconium oxide (ZrO$_2$), lead zirconate titanate (PZT), gallium arsenide (GaAs), oxide hafnium (HfO$_2$), aluminum oxide (Al$_2$O$_3$), titanium oxide (TiO$_2$), zinc oxide (ZnO), and the like, and may be formed of a material different from that of the piezoelectric layer 160. Moreover, if necessary, a region, provided with the insertion layer 180, may be provided as an empty space (air). The region, described above, may be implemented by removing the insertion layer 180 in a manufacturing process.

In an example, a thickness of the insertion layer 180 may be formed to be equal to or similar to a thickness of the first electrode 150. Moreover, the thickness of the insertion layer may be formed to be similar to that of the piezoelectric layer 160 or less than that of the piezoelectric layer 160. For example, the insertion layer 180 is formed to have a thickness of 100 Å or more, and may be formed to have a thickness less than a thickness of the piezoelectric layer 160. The configuration of the insertion layer is not, however, limited to the foregoing examples.

The insertion layer 180 is disposed on a surface formed by the membrane layer 140 and the first electrode 150, and the etching preventing portion 130.

The insertion layer 180 is disposed around the flat portion S and supports the bent portion 164 of the piezoelectric layer 160. Thus, the bent portion 164 of the piezoelectric layer 160 includes the inclined portion 164a and the extended portion 164b disposed along a shape of the insertion layer 180.

The insertion layer 180 is disposed in a region except for the flat portion S. For example, the insertion layer 180 may be disposed in the entirety of a region excluding the flat portion S, or in some regions of a region excluding the flat portion S.

Moreover, at least a portion of the insertion layer 180 is disposed between the piezoelectric layer 160 and the first electrode 150.

A side surface of the insertion layer 180, disposed along a boundary of the flat portion S, may be formed to have a shape having a thickness becoming thicker as a distance from the flat portion S increases. Thus, the insertion layer 180 has a side surface, disposed to be adjacent to the flat portion S, as an inclined surface L having a constant inclination angle θ.

In order to form the inclination angle θ of the side surface of the insertion layer 180 to be less than 5°, a thickness of the insertion layer 180 would be required to be significantly small, or an area of the inclined surface L would be required to be significantly large. Hence, there is difficulty in its implementing the insertion layer 180 such that the inclination angle θ is less than 5°.

Moreover, if the inclination angle θ of the side surface of the insertion layer 180 were greater than 70°, the inclination angle of the inclined portion 164a of the piezoelectric layer 160, which is stacked on the insertion layer 180, would also be greater than 70°. In this case, the piezoelectric layer 160 would be excessively bent, so cracking may occur in a curved portion of the piezoelectric layer 160.

Thus, in an example, the inclination angle θ of the inclined surface L is formed to be within a range of 5° to 70°.

The passivation layer 190 is formed in a region except for a portion of the first electrode 150 and the second electrode 170. The passivation layer 190 may prevent the second electrode 170 and the first electrode 150 from being damaged during a manufacturing process.

Furthermore, a portion of the passivation layer 190 may be removed by etching in order to control frequency in a final manufacturing process. In other words, a thickness of the passivation layer 190 may be adjusted. The passivation layer 190 may be formed of a dielectric layer containing any one material among silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), by way of example.

When the passivation layer 190 is stacked, tensile stress is applied to the passivation layer 190, and the tensile stress applied to the passivation layer 190 may be 0 Mpa to 500 Mpa. When the tensile stress is applied, a lattice constant of the passivation layer is increased in the in-plane direction, and is decreased in the out-of-plane direction, as compared with bulk. For example, when the passivation layer is aluminum nitride, a ratio of lattice constants (out-of-plane to in-plane) is less than 1.58. As described above, tensile stress is applied to the passivation layer 190, so a void in the first electrode 150 and the second electrode 170 may be prevented from being generated. In other words, migration of a material (particles) forming the first electrode 150 and the second electrode 170 is prevented, so occurrence of a surface defect may be prevented.

On the other hand, when compressive stress of 1600 MPa to −400 MPa is applied to allow the ratio c/a between lattice constants to be greater than 1.5, the number of voids generated in a first electrode and a second electrode increases rapidly. Moreover, when tensile stress is applied to allow the ratio c/a between lattice constants to be less than 1.5, the generation of a void in the first electrode 150 and the second electrode 170 may be prevented.

As described above, when the passivation layer 190 is stacked, tensile stress is applied to the passivation layer 190. In this case, the in-plane lattice constant of the passivation layer 190 may be greater than a value of the bulk lattice constant. For example, when the passivation layer is aluminum nitride, or aluminum nitride containing doping elements, and tensile stress is applied, the in-plane lattice constant becomes large, and the out-of-plane lattice constant becomes small, so c/a may be smaller than 1.58.

The metal pad 195 is formed in a portion of the first electrode 150 and the second electrode 170 in which the passivation layer 190 described above is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, tensile stress is applied to the piezoelectric layer 160 and the passivation layer 190 when the piezoelectric layer 160 and the passivation layer 190 are formed, so a defect may be prevented from occurring by migration of a material (particles) forming the first electrode 150 and the second electrode 170.

In more detail, when a first electrode and a second electrode are formed of an aluminum material, mechanical properties are degraded and hillock may occur due to electro migration or mechanical deformation, which may lead to a degradation in crystal orientation of a piezoelectric layer and a performance of a resonator.

In order to prevent this, the first electrode 150 and the second electrode 170 may be formed using an alloy material in which scandium (Sc) is contained in aluminum (Al). Even when the first electrode 150 and the second electrode 170 are formed using an alloy in which scandium (Sc) is contained in aluminum, mechanical properties may be improved. However, when the piezoelectric layer 160 and the passivation layer 190 are stacked on the first electrode 150 and the second electrode 170, occurrence of a defect by migration of a material (particles) forming the first electrode 150 and the second electrode 170 may not be solved.

However, as described above, tensile stress is applied to the piezoelectric layer 160 and the passivation layer 190 when the piezoelectric layer 160 and the passivation layer 190 are formed, so a defect could be prevented from occurring by migration of a material (particles) forming the first electrode 150 and the second electrode 170.

Moreover, the first electrode 150 and the second electrode 170 are formed of an aluminum alloy material containing scandium (Sc), so electrical loss may be improved.

Further, since the mechanical strength may be improved, deposition of the piezoelectric layer 160 may be more stably performed in a sputtering process, so that the crystal orientation may be improved and the chemical resistance may be improved to provide manufacturing stability.

In an example, pure aluminum (Al), and an aluminum alloy (AlSc) containing scandium (Sc) were deposited on a seed layer formed of an aluminum nitride (AlN) material and having a thickness of 500 Å, so as to have a thickness of 1500 Å, and then surface defects were observed. In the case of the pure aluminum (Al), many defects caused by hillock and grain boundary groove were observed. On the other hand, in the case of the aluminum alloy (AlSc) containing scandium (Sc), defects caused by hillock and grain boundary grooves were significantly reduced.

The bulk-acoustic wave resonator 100 configured as described above may significantly reduce frequency loss while increasing heat dissipation characteristics. These attributes will be described with reference to FIGS. 5 and 6.

Figure 5:
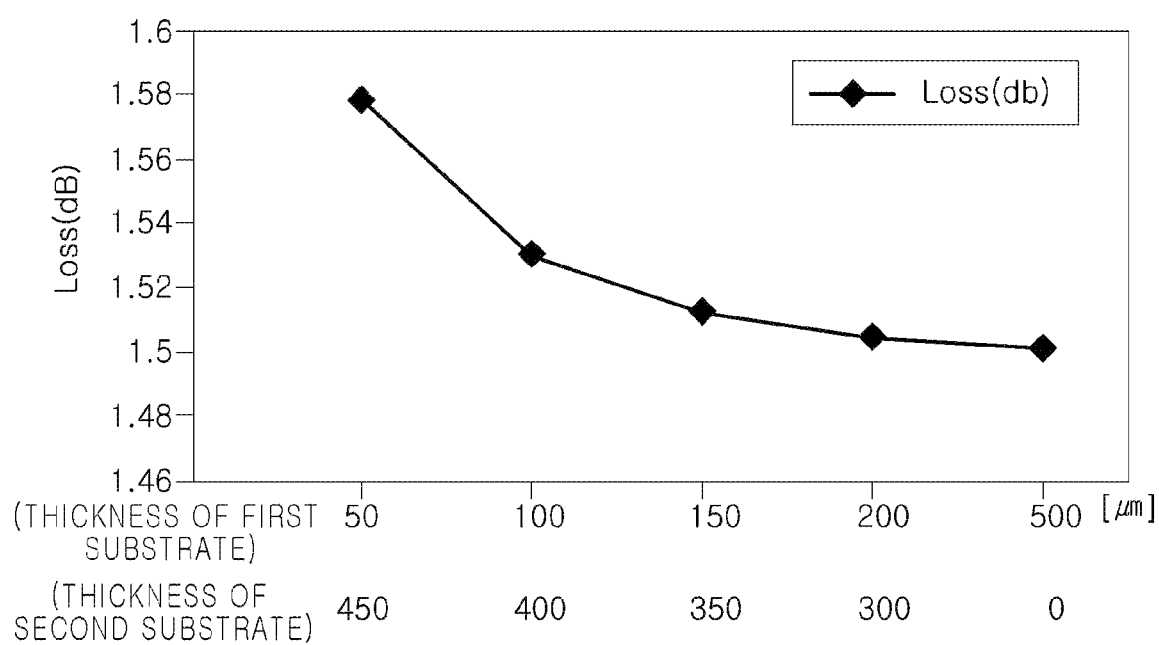
FIG. 5 is a graph comparing frequency loss according to a substrate structure.

FIG. 5 illustrates frequency loss to a thickness ratio of the first substrate 112 in examples in which the first substrate is formed of a silicon material and the second substrate 114 is formed of a silicon carbide material. For reference, a total thickness of a substrate, including the first substrate 112 and the second substrate 114, is equal to 500 μm.

In an example in which a thickness of the first substrate 112 is 50 μm and a thickness of the second substrate 114 is 450 μm, relatively high frequency loss (1.58 dB) occurred. On the other hand, in an example in which a thickness of the first substrate 112 is 150 μm and a thickness of the second substrate 114 is 350 μm, an example in which a thickness of the first substrate 112 is 200 μm and a thickness of the second substrate 114 is 30 μm, and an example in which only the first substrate 112 is included, relatively low frequency loss (1.50 dB) occurred.

Figure 6:
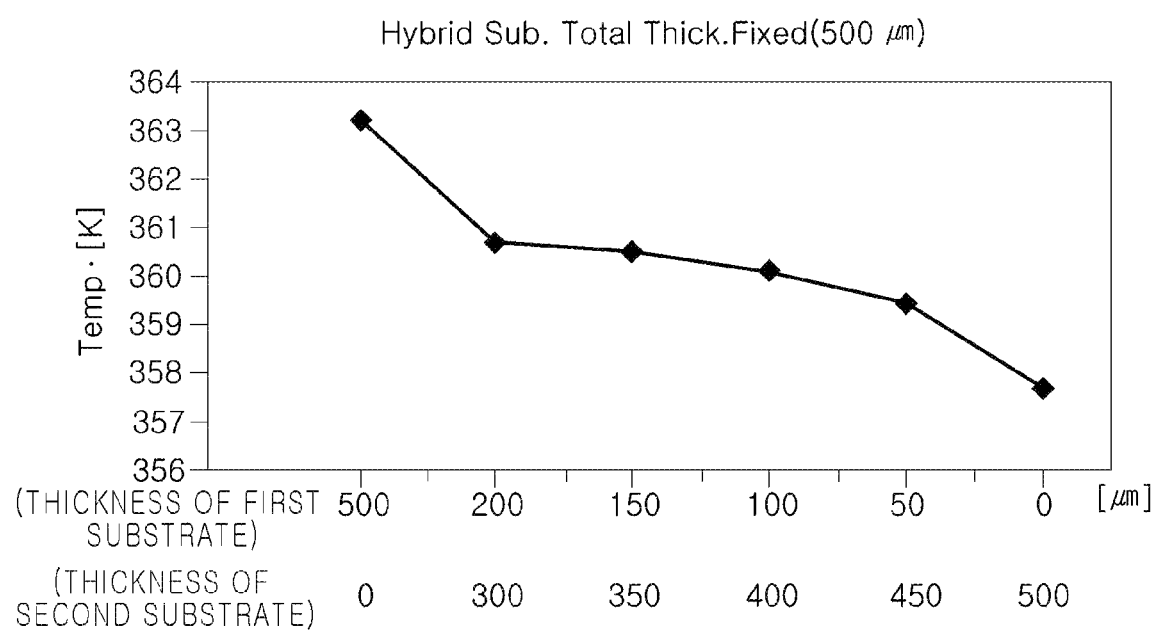
FIG. 6 is a graph comparing heat dissipation characteristics according to a substrate structure.

FIG. 6 illustrates heat dissipation characteristics to a thickness ratio of the first substrate 112 in examples in which the first substrate 112 is formed of a silicon material and the second substrate 114 is formed of a silicon carbide material. For reference, a total thickness of a substrate, including the first substrate 112 and the second substrate 114, is equal to 500 μm.

In an example in which only the second substrate 114 formed of a silicon carbide material is included, a temperature of the bulk-acoustic wave resonator when 36 dB of power is applied to the filter device was the lowest (358K). In other words, an example in which only the second substrate 114 formed of a silicon carbide material is included exhibited the best heat dissipation characteristics. In contrast, in an example in which only the first substrate 112 formed of a silicon material is included, a temperature of the bulk-acoustic wave resonator when 36 dB of power is applied to the filter device was the highest (363K). In other words, an example in which only the first substrate 112 formed of a silicon material is included exhibited the worst heat dissipation characteristics. Moreover, in an example in which a thickness of the first substrate 112 is 50 μm and a thickness of the second substrate 114 is 450 μm, an example in which a thickness of the first substrate 112 is 100 μm and a thickness of the second substrate 114 is 400 μm, an example in which a thickness of the first substrate 112 is 150 μm and a thickness of the second substrate 114 is 350 μm, and an example in which a thickness of the first substrate 112 is 200 μm and a thickness of the second substrate 114 is 30 μm, heat dissipation characteristics were generally good.

Through the above experimental examples, it was confirmed that frequency loss and heat dissipation characteristics were good while a thickness ratio (t1/t2) of the first substrate 112 formed of a silicon material and the second substrate 114 formed of a silicon carbide material is in a range of 0.25 to 0.67. In other words, if a ratio (t1/t2) of a thickness (t1) of the first substrate 112 to a thickness (t2) of the second substrate 114 is outside of a lower limit value of the numerical range described above, frequency loss may be reduced, but heat dissipation characteristics may become worse. In contrast, if the ratio (t1/t2) of the thickness (t1) of the first substrate 112 to the thickness (t2) of the second substrate 114 is outside of an upper limit value of the numerical range described above, heat dissipation characteristics may be excellent, but frequency loss may become worse. Table 1, provided below, summarizes these relationships.

TABLE 1

| Thickness [μm] of first substrate | Thickness [μm] of second substrate | Frequency loss [dB] | Heat dissipation characteristics[ΔT] |
| --- | --- | --- | --- |
| 50 | 450 | 1.578 | 359.481 |
| 100 | 400 | 1.530 | 360.102 |
| 150 | 350 | 1.512 | 360.508 |
| 200 | 300 | 1.504 | 360.699 |
| 500(Comparative Example) | 0 | 1.501 | 363.185 |

Figure 7:
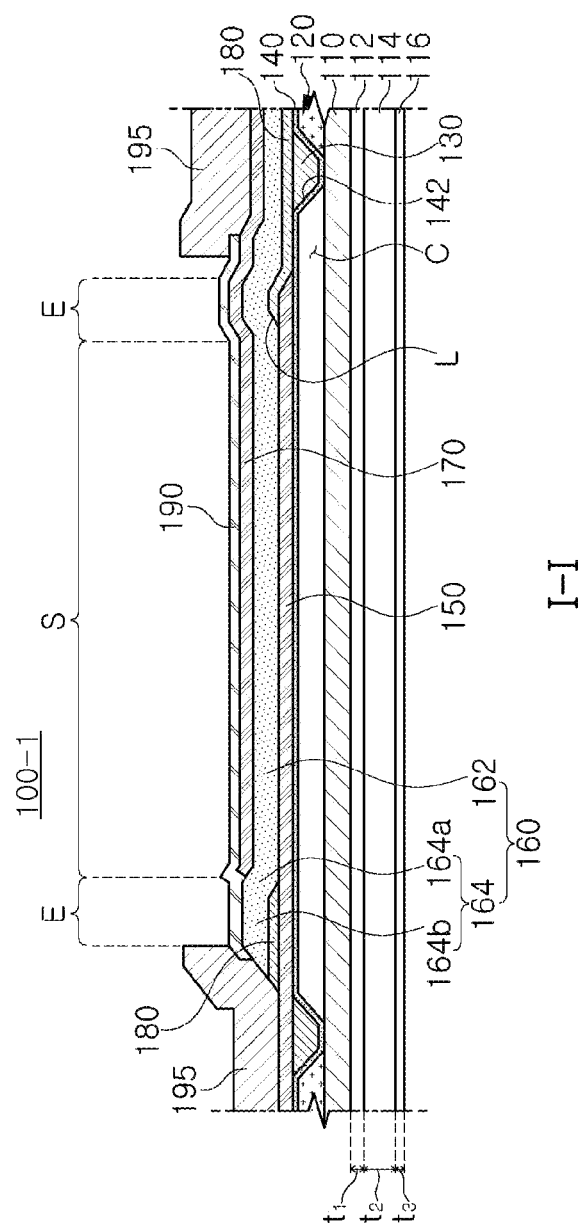
FIG. 7 is a cross-sectional view illustrating a bulk-acoustic wave resonator, according to another example.

Next, referring to FIG. 7, a bulk-acoustic wave resonator 100-1, according to another example, will be described.

In comparison with the bulk-acoustic wave resonator 100 of FIGS. 1-4, the bulk-acoustic wave resonator 100-1 further includes a third substrate 116. The third substrate 116 is formed on a lower surface of the second substrate 114, and may be formed of the same material as the first substrate 112. The third substrate 116 may have a predetermined thickness t3. For example, the thickness t3 of the third substrate 116 may be less than a thickness t1 of the first substrate 112 and a thickness t2 of the second substrate 114. In addition, the thickness t3 of the third substrate 116 may satisfy Conditional Expressions 2-4, below.

$t3<t1$ [Conditional Expression 2]

$t3<t2$ [Conditional Expression 3]

$0.25<(t1+t3)/t2<0.67$ [Conditional Expression 4]

Figure 8:
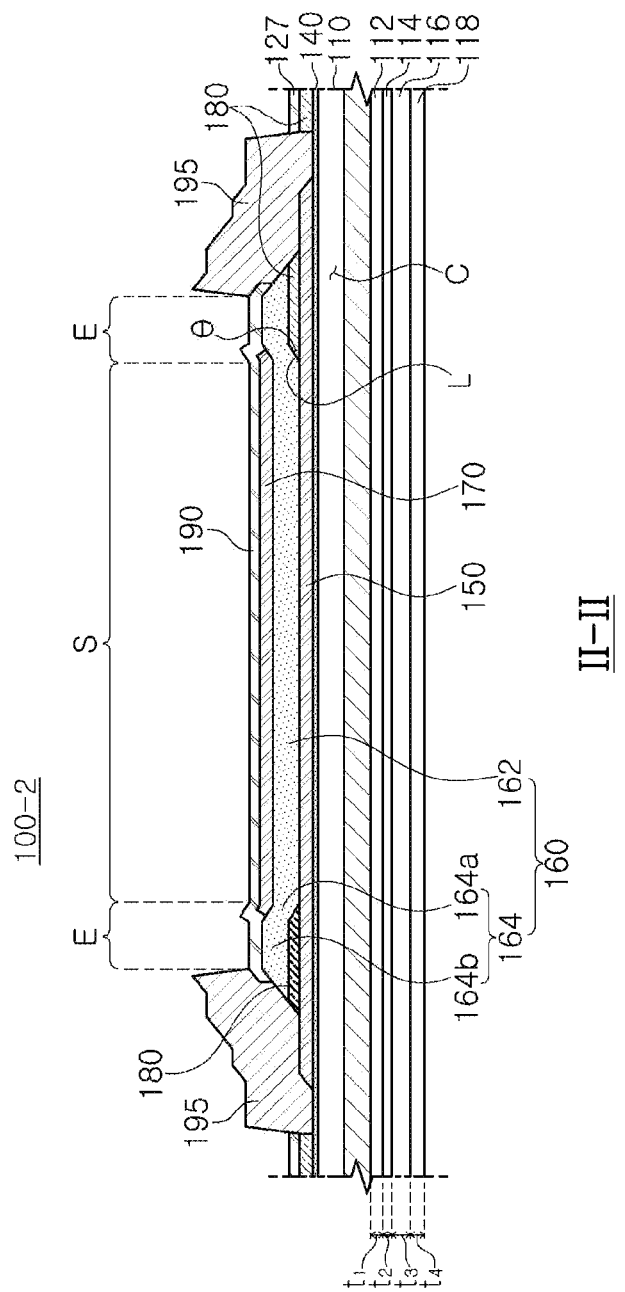
FIG. 8 is a cross-sectional view taken along line I-I and illustrating a bulk-acoustic wave resonator, according to another example.

Referring to FIG. 8, a bulk-acoustic wave resonator 100-2, according to another example, will be described.

In comparison with the bulk-acoustic wave resonator 100 of FIGS. 1-4, the bulk-acoustic wave resonator 100-2 further includes the third substrate 116 and a fourth substrate 118. The third substrate 116 is formed on a lower surface of the second substrate 114, and the fourth substrate 118 is formed on a lower surface of the third substrate 116. The third substrate 116 may be formed of the same material as the first substrate 112, and the fourth substrate 118 may be formed of the same material as the second substrate 114. The third substrate 116 and the fourth substrate 118 may have a predetermined thickness t3 and a predetermined thickness t4, respectively. For example, the thickness t3 of the third substrate 116 may be less than the thickness t1 of the first substrate 112 and the thickness t2 of the second substrate 114, and the thickness t4 of the fourth substrate 118 may be less than the thickness t2 of the second substrate 114 and greater than the thickness t3 of the third substrate 116. In addition, the thickness t3 of the third substrate 116 and the thickness t4 of the fourth substrate 118 may satisfy Conditional Expressions 5-7, provided below.

$$t3<t1<t2 \qquad \text{[Conditional Expression 5]}$$

$$t3<t4<t2 \qquad \text{[Conditional Expression 6]}$$

$$0.25<(t1+t3)/(t2+t4)<0.67 \qquad \text{[Conditional Expression 7]}$$

Figure 9:
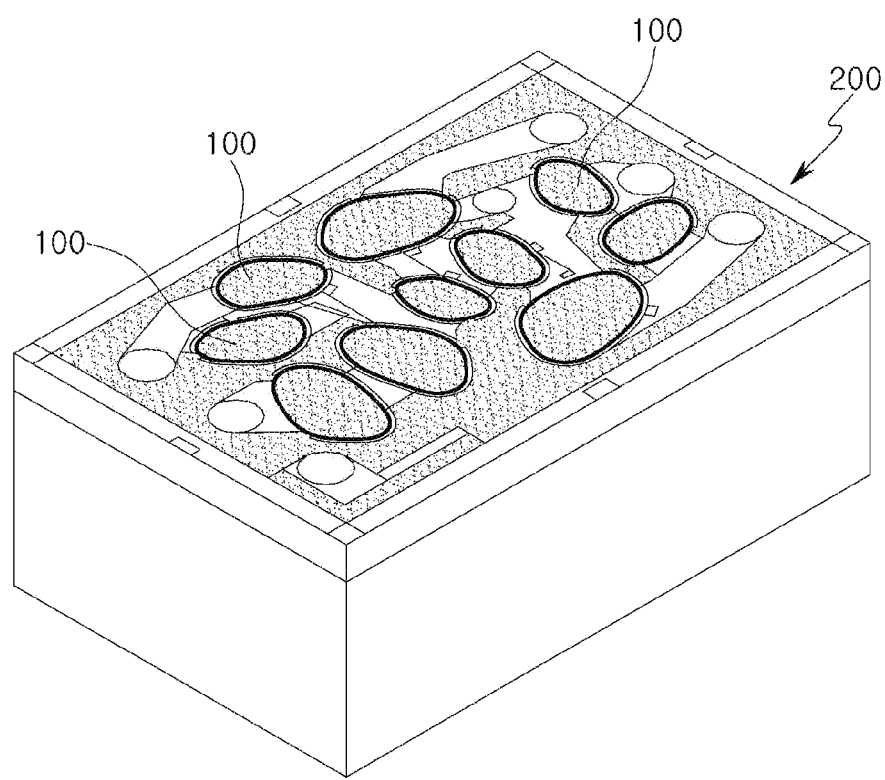
FIG. 9 is a plan view of a bulk surface wave filter, according to an example.

Next, a bulk surface wave filter 200 including one or more bulk-acoustic wave resonators 100, which are described above with respect to FIG. 1, will be described with reference to FIG. 9. Although the bulk surface wave filter 200 is shown and described as including the bulk-acoustic wave resonators 100, it is to be understood that the bulk surface wave filter 200 may instead include one or more bulk acoustic wave resonators 100-1 or 100-2, which are described above with respect to FIGS. 7 and 8.

For example, all bulk-acoustic wave resonators forming the bulk surface wave filter 200 may be configured in the form according to the example described above. As another example, a portion of the bulk-acoustic wave resonators configuring the bulk surface wave filter 200 may be configured to have a form according to an example disclosed above, and a remaining portion of the bulk-acoustic wave resonators may be configured in a form according to one of other examples disclosed above. As another example, only a portion of bulk-acoustic wave resonators forming the bulk surface wave filter 200 may be configured in the form according to an example described above.

As set forth above, according to an embodiments disclosed herein, a bulk-acoustic wave resonator capable of effectively dissipating heat generated inside the bulk-acoustic wave resonator may be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a first substrate formed of a first material;
an insulating layer or a piezoelectric layer disposed on a first side of the first substrate; and
a second substrate formed of a second material, and disposed on a second side of the first substrate,
wherein the second material has thermal conductivity that is higher than a thermal conductivity of the first material,
wherein $0.25<t1/t2<0.67$ is satisfied, and
wherein t1 is a thickness of the first substrate and t2 is a thickness of the second substrate.

2. A bulk acoustic wave filter comprising the bulk-acoustic wave resonator of claim 1.

3. The bulk-acoustic wave resonator of claim 1, wherein the first substrate is formed of silicon (Si), and the second substrate is formed of a silicon carbide (SiC) compound.

4. The bulk-acoustic wave resonator of claim 1, further comprising: a third substrate disposed on one side of the second substrate.

5. The bulk-acoustic wave resonator of claim 4, wherein the third substrate is formed of the first material.

6. The bulk-acoustic wave resonator of claim 5, wherein $0.25<(t1+t3)/t2<0.67$ is satisfied, and
wherein t3 is a thickness of the third substrate.

7. The bulk-acoustic wave resonator of claim 4, wherein a thickness of the third substrate is less than the thickness of the first substrate.

8. The bulk-acoustic wave resonator of claim 4, further comprising: a fourth substrate disposed on one side of the third substrate.

9. The bulk-acoustic wave resonator of claim 8, wherein the fourth substrate is formed of the second material.

10. The bulk-acoustic wave resonator of claim 8, wherein a thickness of the fourth substrate is less than the thickness of the second substrate.

11. The bulk-acoustic wave resonator of claim 8, wherein $0.25<(t1+t3)/(t2+t4)<0.67$ is satisfied, and wherein t3 is a thickness of the third substrate, and t4 is a thickness of the fourth substrate.

12. A bulk-acoustic wave resonator, comprising:
a first substrate formed of a first material;
an insulating layer or a piezoelectric layer disposed on a first side of the first substrate;
a second substrate formed of a second material, and disposed on a second side of the first substrate; and
a third substrate disposed on one side of the second substrate,
wherein the second material has thermal conductivity that is higher than a thermal conductivity of the first material, and
wherein a thickness of the third substrate is less than a thickness of the first substrate.

13. A bulk-acoustic wave resonator, comprising:
a first substrate formed of silicon (Si);
an insulating layer disposed on a first side of the first substrate;
a membrane layer disposed on the insulating layer, and defining a cavity between insulating layer and the membrane layer;
a piezoelectric layer disposed on the membrane layer; and
a second substrate formed of a silicon carbide (SiC) compound and disposed on a second side of the first substrate.

14. The bulk-acoustic wave resonator of claim 13, a thickness of the second substrate is greater than a thickness of the first substrate.

15. The bulk-acoustic wave resonator of claim 13, further comprising: a third substrate formed of Si and disposed on a side of the second substrate that is opposite to a side of the second substrate that is disposed on the second side of the first substrate.

16. The bulk-acoustic wave resonator of claim 15, wherein a thickness of the second substrate is greater than a thickness of the first substrate, and a thickness of the third substrate is less than the thickness of the first substrate.

17. The bulk-acoustic wave resonator of claim 15, further comprising: a fourth substrate formed of the SiC compound and disposed on a side of the third substrate that is opposite to a side of the third substrate that is disposed on the second substrate.

18. The bulk-acoustic wave resonator of claim 17, wherein a thickness of the second substrate is greater than a thickness of the first substrate, a thickness of the third substrate is less than the thickness of the first substrate, and a thickness of the fourth substrate is less than the thickness of the second substrate.

* * * * *